(12) United States Patent
Lin et al.

(10) Patent No.: US 8,149,327 B2
(45) Date of Patent: Apr. 3, 2012

(54) CAMERA MODULE WITH DUAL LENS MODULES AND IMAGE SENSORS

(75) Inventors: Hou-Yao Lin, Taipei Hsien (TW); Sheng-Jung Yu, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 324 days.

(21) Appl. No.: 12/633,877

(22) Filed: Dec. 9, 2009

(65) Prior Publication Data
US 2010/0231779 A1   Sep. 16, 2010

(30) Foreign Application Priority Data
Mar. 13, 2009  (CN) .......................... 2009 1 0300826

(51) Int. Cl.
*H04N 5/225* (2006.01)
*H04N 9/097* (2006.01)
(52) U.S. Cl. ........................ 348/374; 348/262
(58) Field of Classification Search .................. 348/264, 348/262, 374
See application file for complete search history.

(56) References Cited

U.S. PATENT DOCUMENTS

| | | | | |
|---|---|---|---|---|
| 6,726,331 B2* | 4/2004 | Miyata | ............................. | 353/31 |
| 7,453,517 B2* | 11/2008 | Fujimoto et al. | .............. | 348/374 |
| 7,619,683 B2* | 11/2009 | Davis | ............................ | 348/374 |
| 2004/0220464 A1* | 11/2004 | Benninger et al. | ............ | 600/407 |
| 2010/0165155 A1* | 7/2010 | Chang | ............................ | 348/262 |

* cited by examiner

*Primary Examiner* — James Hannett
(74) *Attorney, Agent, or Firm* — Altis Law Group, Inc.

(57) ABSTRACT

A camera module includes first and second lens modules, a first holder receiving the first lens module therein, a second holder receiving the second lens modules therein, a circuit board arranged between the first and second holders, first and second image sensors arranged on opposite surfaces of the circuit board, and first and second reflecting members. The first image sensor is received in the first holder. The second image sensor is received in the second holder. The first reflecting member is arranged in the first holder and has a first reflecting surface for reflecting and directing the light converged by the first lens module to the first image sensor. The second reflecting member is arranged in the second holder and has a second reflecting surface for reflecting and directing the light converged by the second lens module to the second image sensor.

17 Claims, 6 Drawing Sheets

CAMERA MODULE WITH DUAL LENS MODULES AND IMAGE SENSORS

BACKGROUND

1. Technical Field

The present disclosure relates to camera modules, and particularly, to camera module having dual lens modules and image sensors.

2. Description of Related Art

Lens modules and image sensors are key components of camera modules. The lens module is configured (structured and arranged) for converging light incident thereon to the image sensor, and the image sensor is configured for forming images.

Dual lens modules have been widely used in camera modules. Such camera module usually has only one image sensor. When adjusting distance between the lens modules, two or more focal lengths can be obtained, thus the camera module has the zooming function. However, in this way, a driving apparatus has to be used to adjust the distance between the lens modules.

Dual lens modules and image sensors have been proposed in a camera module to allow the camera module to have two fixed focal lengths. However, in this way, the image sensors have to be disposed at imaging planes (parallel to focal planes) along optical axis directions of the lens modules, respectively, such that the light converged by the lens modules will fall on the image sensors. However, with this configuration, the length of the camera module will be much greater than width of the camera module, thus a good-looking camera module cannot be obtained.

What is needed, therefore, is a camera module with dual lens modules and image sensors, which can overcome the above shortcomings.

BRIEF DESCRIPTION OF THE DRAWINGS

Many aspects of the present camera module can be better understood with reference to the following drawings. The components in the drawings are not necessarily drawn to scale, the emphasis instead being placed upon clearly illustrating the principles of the present camera module. Moreover, in the drawings, like reference numerals designate corresponding parts throughout the several views.

DETAILED DESCRIPTION

Embodiments of the present camera module will now be described in detail below and with reference to the drawings.

Figure 1:
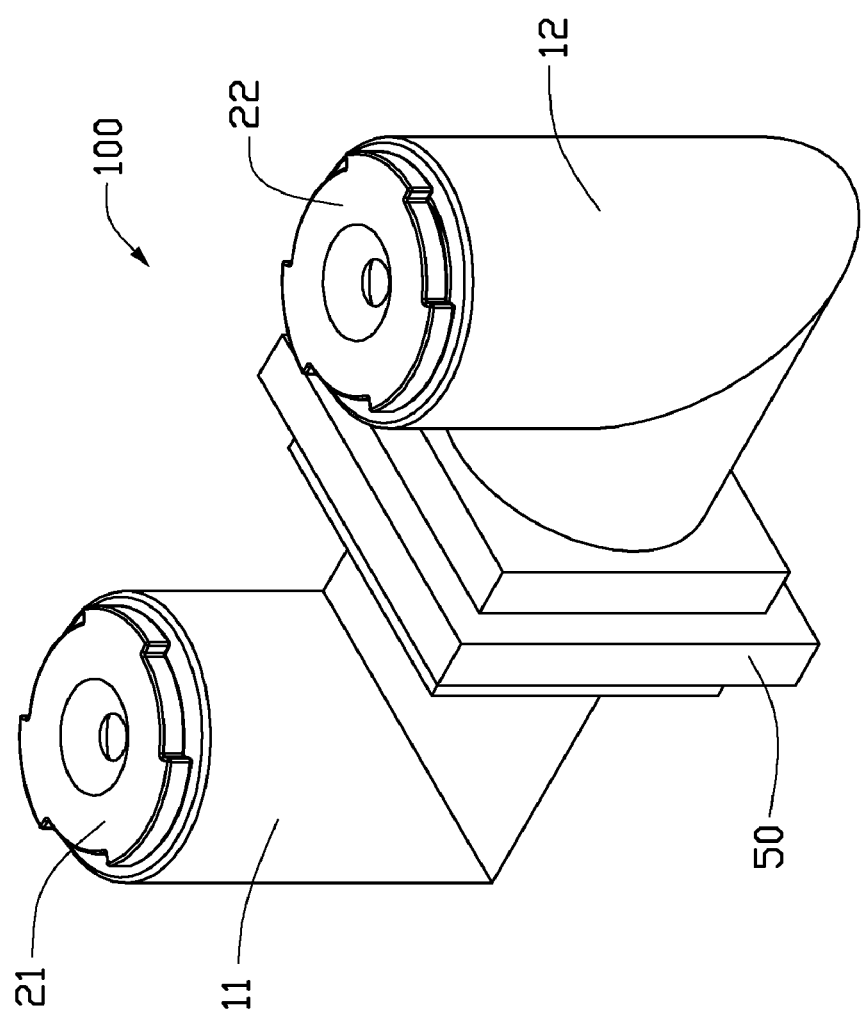
FIG. 1 is an isometric schematic view of a camera module in accordance with a first embodiment.
Figure 2:
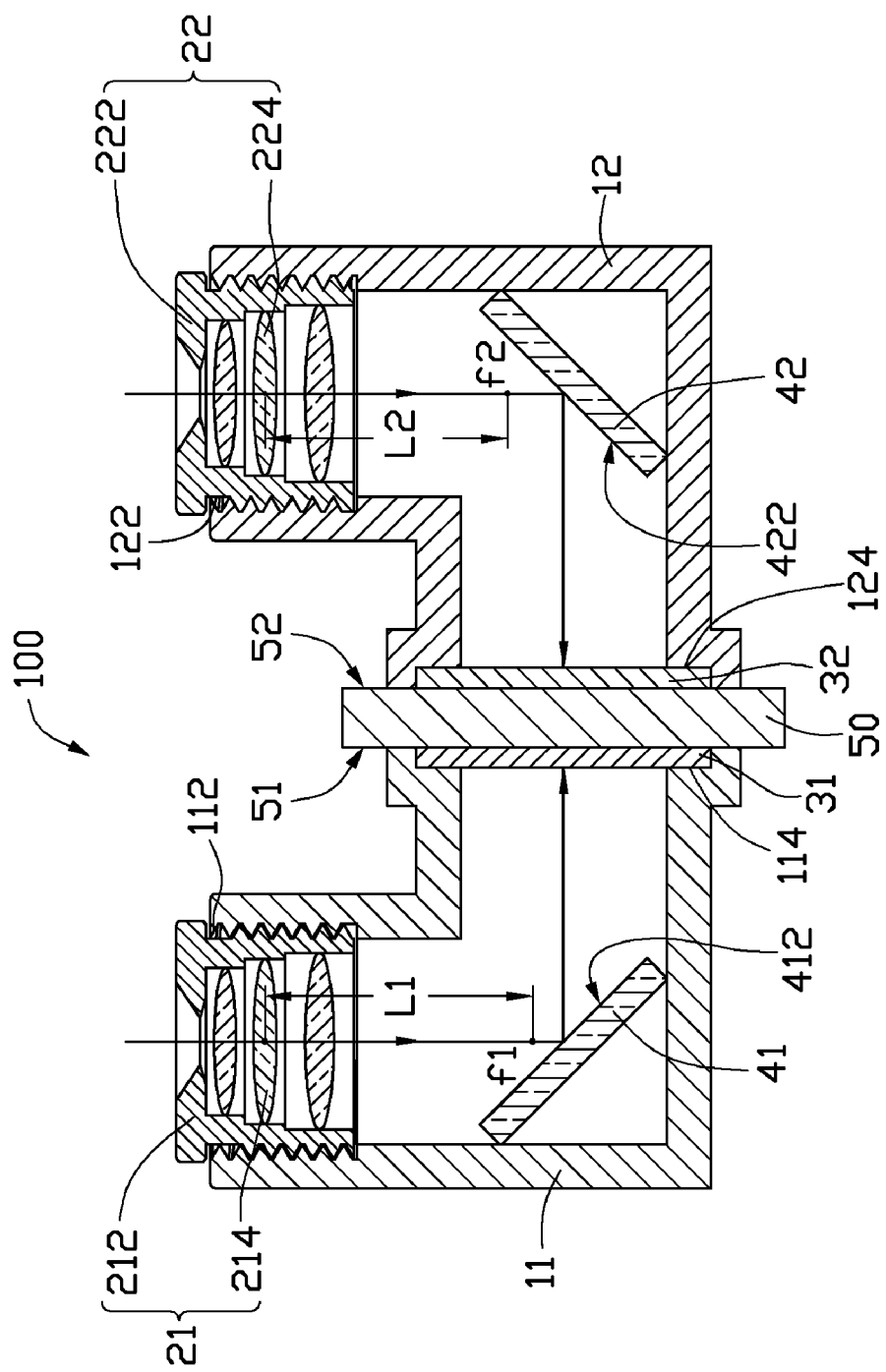
FIG. 2 is a cross-sectional view of the camera module shown in FIG. 1.

Referring to FIGS. 1 and 2, a camera module 100 in accordance with a first embodiment, is provided. The camera module 100 includes a first lens module 21, a second lens module 22, a first holder 11, a second holder 12, a circuit board 50, a first image sensor 31, a second image sensor 32, a first reflecting member 41, and a second reflecting member 42.

The first holder 11 includes a first opening 112 and a third opening 114 formed at two ends thereof. The second holder 12 includes a second opening 122 and a fourth opening 124 formed at two ends thereof. The first holder 11 and the second holder 12 are both "L" shaped. A central axis of the first opening 112 is parallel to that of the second opening 122, and the first opening 112 and the second opening 122 face a same direction. A central axis of the third opening 114 is aligned with that of the fourth opening 124. The central axis of the first opening 112 is perpendicular to the central axis of the third opening 114, and the central axis of the second opening 122 is perpendicular to the central axis of the fourth opening 124. The first opening 112 and the second opening 122 are both internally threaded.

The first lens module 21 includes a first lens barrel 212 and a plurality of lenses 214 received in the first lens barrel 212. The second lens module 22 includes a second lens barrel 222 and a plurality of lenses 224 received in the second lens barrel 222. The first and second lens barrels 212, 222 are both externally threaded. The first lens barrel 212 is threadedly engaged in the first opening 112. The second lens barrel 222 is threadedly engaged in the second opening 122. The first and second lens modules 21, 22 each define an optical axis, and the optical axes are aligned with the central axes of the first and second openings 112, 122, respectively. The first lens module 21 is substantially a converging lens system, and has a first focal length L1, and the second lens module 22 is also substantially a converging lens system, and has a second focal length L2. The first focal length L1 is different from the second focal length L2, thus the camera module 100 has two different focal lengths.

The circuit board 50 is arranged between the first holder 11 and the second holder 12. The circuit board 50 includes a first surface 51 and an opposite second surface 52. The end surface of the third opening 114 is coupled to the first surface 51, and the end surface of the fourth opening 124 is coupled to the second surface 52.

The first image sensor 31 is mounted to the first surface 51 of the circuit board 50, and is received in the third opening 114. The second image sensor 32 is mounted to the second surface 52 of the circuit board 50, and is received in the fourth opening 124.

The first and second reflecting members 41, 42 are disposed after the focal points f1, f2 of the first and second focal lengths L1, L2, and before image planes along the optical axis directions of the first lens modules 21 and the second lens modules 22. The first and second reflecting members 41, 42 are configured for changing light paths before any light focus on the imaging planes along the optical axis direction. The first reflecting member 41 has a first reflecting surface 412 facing the first lens module 21 and the first image sensor 31. The second reflecting member 42 has a second reflecting surface 422 facing the second lens module 22 and the second image sensor 32. A first acute angle is maintained between the central axis of the first opening 112 and the first reflecting surface 412, and a second acute angle is maintained between the central axis of the second opening 122 and second reflecting surface 422. In the present embodiment, both the first acute angle and the second acute angle are 45 degrees.

In operation, light rays reflected by objects are substantially converged when they transmit through the first lens module 21 and the second lens module 22, except those directly transmitted through the centers of the first lens module 21 and the second lens module 22. The converged light rays are reflected by the first reflecting surface 412 and the second reflecting surface 422, and the reflected converged light rays fall on the first image sensor 31 and the second image sensor 32, respectively, thus the first image sensor 31 and the second image sensor 32 detect the images of the objects.

With the above configuration, the first and second image sensors 31 and 32 do not need to be disposed at imaging planes along the optical axis direction of the first and second lens modules 21, 22, thus the entire length of the camera modules 100 can be shortened.

Figure 3:
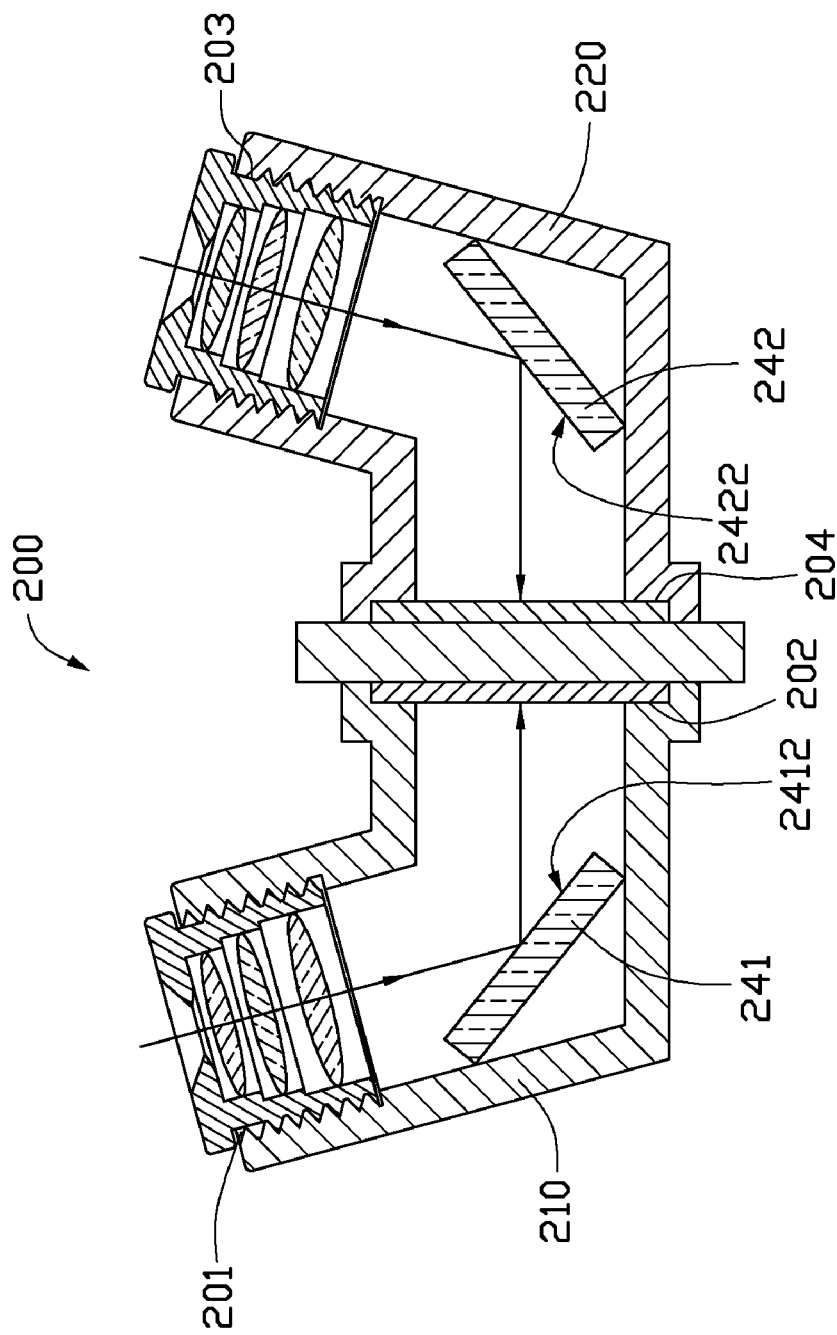
FIG. 3 is a cross-sectional view of a camera module in accordance with a second embodiment.

Referring to FIG. 3, a camera module 200 in accordance with a second embodiment is provided. A central axis of a first opening 201 of a first holder 210 is not parallel to, but intersects with a central axis of a second opening 203 of a second holder 220 at a point (not shown) under the first and second holders 210, 220. A central axis of a third opening 202 of the first holder 210 is not perpendicular to the central axis of the first opening 201, instead, a first obtuse angle is maintained between the central axis of the first opening 201 and the central axis of the third opening 202. A central axis of a fourth opening 204 of the second holder 220 is not perpendicular to the central axis of the second opening 203, instead, a second obtuse angle is maintained between the central axis of the second opening 203 and the central axis of the fourth opening 204. The first obtuse angle can be the same as that of the second obtuse angle. An included acute angle between the central axis of the first opening 201 and a first reflecting surface 2412 of a first reflecting members 241 is not greater than 45 degrees; and an included acute angle between the central axis of the second opening 203 and a second reflecting surface 2422 of a second reflecting members 242 is not greater than 45 degrees.

Figure 4:
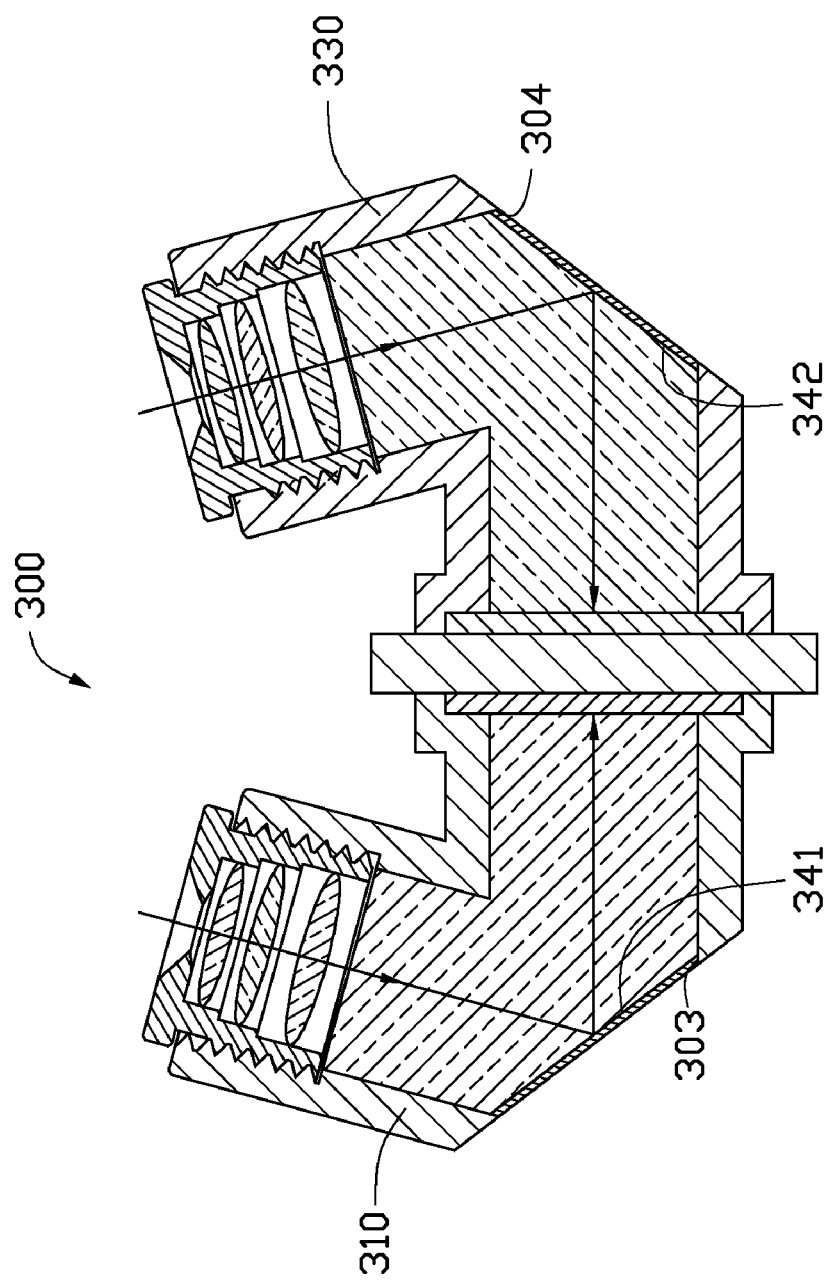
FIG. 4 is a cross-sectional view of a camera module in accordance with a third embodiment.

Referring to FIG. 4, a camera module 300 in accordance with a third embodiment is provided. The camera module 300 is essentially similar to the camera module 200 illustrated above, however, a fifth opening 303 is formed in a first holder 310, and a sixth opening 304 is formed in a second holder 330. A first reflecting member 341 is retained at the fifth opening 303, and a second reflecting member 342 is retained at the sixth opening 304. The fifth opening 303 and the sixth opening 304 facilitate the first reflecting member 341 and the second reflecting member 342 to be mounted in the first and second holders 310, 330. In addition, a central axis of a first opening 301 and a central axis of a second opening 303 intersect at point (not shown) above the first and second holders 310, 330.

Figure 5:
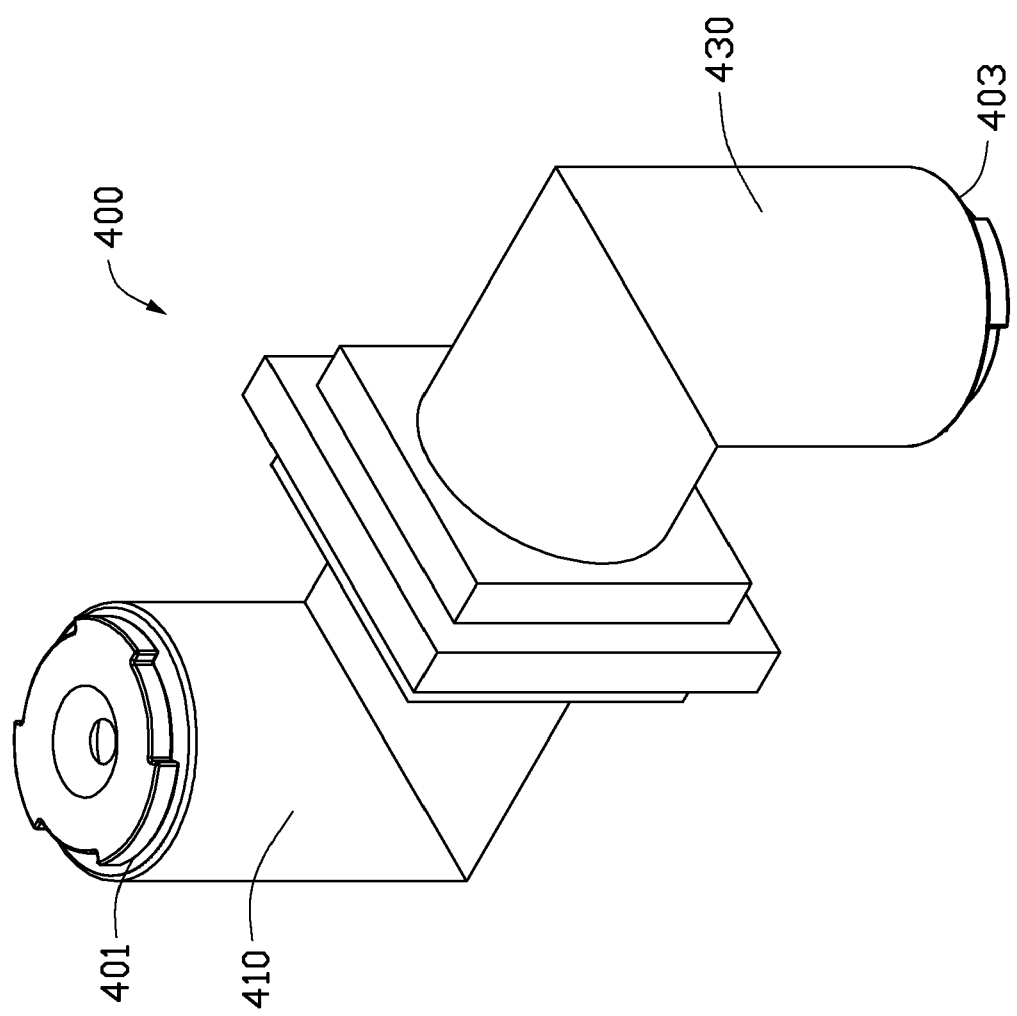
FIG. 5 an isometric schematic view of a camera module in accordance with a fourth embodiment.

Referring to FIG. 5, a camera module 400 in accordance with a fourth embodiment is provided. The camera module 400 is essentially similar to the camera module 100 illustrated above, however, in the camera module 400, a first opening 401 of a first holder 410 and a second opening 403 of a second holder 430 face opposite directions.

Figure 6:
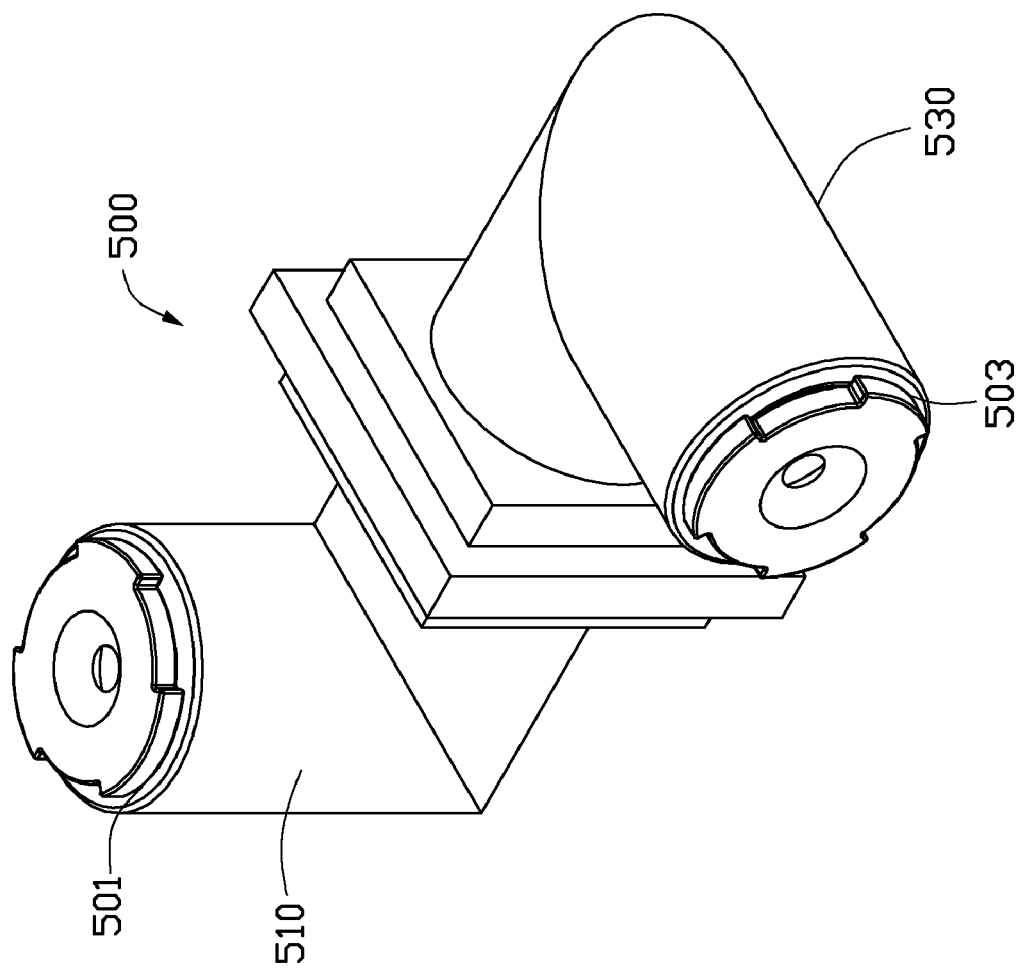
FIG. 6 is an isometric schematic view of a camera module in accordance with a fifth embodiment.

Referring to FIG. 6, a camera module 500 in accordance with a fifth embodiment is provided. The camera module 500 is essentially similar to the camera module 400 illustrated above, however, in the camera module 500, a first opening 501 of a first holder 510 and a second opening 503 of a second holder 530 face different directions, and a central axis of the first opening 501 is perpendicular to a central axis of the second opening 503.

It is understood that the above-described embodiments are intended to illustrate rather than limit the disclosure. Variations may be made to the embodiments without departing from the spirit of the disclosure. Accordingly, it is appropriate that the appended claims be construed broadly and in a manner consistent with the scope of the disclosure.

What is claimed is:

1. A camera module, comprising:
    a first lens module having a first focal length, the first lens module configured for converging light incident thereon;
    a second lens module having a second focal length, the second lens module configured for converging light incident thereon;
    a first holder comprising a first opening configured for receiving the first lens module therein;
    a second holder comprising a second opening configured for receiving the second lens module therein;
    a circuit board arranged between the first holder and the second holder, the circuit board comprising a first surface facing the first holder, and an opposite second surface facing the second holder;
    a first image sensor received in the first holder and arranged on the first surface of the circuit board;
    a second image sensor received in the second holder and arranged on the second surface of the circuit board;
    a first reflecting member arranged in the first holder and having a first reflecting surface configured for reflecting and directing the light converged by the first lens module to the first image sensor; and
    a second reflecting member arranged in the second holder and having a second reflecting surface configured for reflecting and directing the light converged by the second lens module to the second image sensor.

2. The camera module as described in claim 1, wherein the first opening and the second opening both have inner threads formed therein, the first lens module comprises a first lens barrel and a plurality of lenses received in the first lens barrel, the first lens barrel having outer threads formed thereon, the second lens module comprises a second lens barrel and a plurality of lenses received in the second lens barrel, the second lens barrel having outer threads formed thereon, the first lens barrel and the second lens barrel are threadedly engaged in the first opening and the second opening, respectively.

3. The camera module as described in claim 1, wherein the first holder further comprises a third opening, the second holder further comprises a fourth opening, the first image sensor is received in the third opening, the second image sensor is received in the fourth opening, an end surface of the third opening is coupled to the first surface of the circuit board, and an end surface of the fourth opening is coupled to the second surface of the circuit board.

4. The camera module as described in claim 3, wherein an included angle maintained between a central axis of the third opening and that of the first opening is the same as an included angle maintained between a central axis of the fourth opening and that of the second opening.

5. The camera module as described in claim 3, wherein a central axis of the third opening is perpendicular to that of the first opening, and a central axis of the fourth opening is perpendicular to that of the second opening.

6. The camera module as described in claim 3, wherein a central axis of the third opening is aligned with that of the fourth opening.

7. The camera module as described in claim 6, wherein a central axis of the first opening is parallel with that of the second opening.

8. The camera module as described in claim 6, wherein a central axis of the first opening is perpendicular to that of the second opening.

9. The camera module as described in claim 6, wherein a central axis of the first opening intersects with that of the second opening.

10. The camera module as described in claim 1, wherein an acute angle is maintained between the central axis of the first opening and the first reflecting surface, and an acute angle is maintained between the central axis of the second opening and the second reflecting surface.

11. A camera module, comprising:
- a first lens module having a first focal length, the first lens module configured for converging light incident thereon;
- a second lens module having a second focal length, the second lens module configured for converging light incident thereon;
- a first holder comprising a first opening configured for receiving the first lens module therein, and a third opening;
- a second holder comprising a second opening configured for receiving the second lens module therein, and a fourth opening;
- a circuit board comprising a first surface and an opposite second surface, an end surface of the third opening of the first holder being coupled to the first surface, and end surface of the fourth opening of the second holder being coupled to the second surface;
- a first image sensor received in the third opening of the first holder and mounted to the first surface of the circuit board;
- a second image sensor received in the fourth opening of second holder and mounted to the second surface of the circuit board;
- a first reflecting member arranged in the first holder and having a first reflecting surface configured for reflecting and directing the light converged by the first lens module to the first image sensor; and
- a second reflecting member arranged in the second holder and having a second reflecting surface configured for reflecting and directing the light converged by the second lens module to the second image sensor.

12. The camera module as described in claim 11, wherein an included angle maintained between a central axis of the third opening and that of the first opening is the same as an included angle maintained between a central axis of the fourth opening and that of the second opening.

13. The camera module as described in claim 11, wherein a central axis of the third opening is aligned with that of the fourth opening.

14. The camera module as described in claim 11, wherein an acute angle is maintained between a central axis of the first opening and the first reflecting surface, and an acute angle is maintained between a central axis of the second opening and the second reflecting surface.

15. The camera module as described in claim 11, wherein a central axis of the third opening is perpendicular to that of the first opening, and a central axis of the fourth opening is perpendicular to that of the second opening.

16. The camera module as described in claim 11, wherein the first holder further comprises a fifth opening, the first reflecting member is retained in the fifth opening; the second holder further comprises sixth opening, the second reflecting member is retained in the sixth opening.

17. A camera module, comprising:
- a first lens module having a first focal length, the first lens module configured for converging light incident thereon;
- a second lens module having a second focal length, the second lens module configured for converging light incident thereon;
- a first holder comprising a first opening configured for receiving the first lens module therein, and a third opening;
- a second holder comprising a second opening configured for receiving the second lens module therein, and a fourth opening;
- a circuit board comprising a first surface and an opposite second surface, an end surface of the third opening of the first holder being coupled to the first surface, and end surface of the fourth opening of the second holder being coupled to the second surface;
- a first image sensor received in the third opening of the first holder and mounted to the first surface of the circuit board;
- a second image sensor received in the fourth opening of second holder and mounted to the second surface of the circuit board;
- a first reflecting member arranged in the first holder and having a first reflecting surface configured for reflecting the light converged by the first lens module, an acute angle being maintained between a central axis of the first opening and the first reflecting surface, the first image sensor configured for receiving the reflected converged light; and
- a second reflecting member arranged in the second holder and having a second reflecting surface configured for reflecting the light converged by the second lens module, and an acute angle being maintained between a central axis of the second opening and the second reflecting surface, the second image sensor configured for receiving the reflected converged light.

* * * * *